(12) United States Patent
Vera Villarroel et al.

(10) Patent No.: US 11,006,193 B2
(45) Date of Patent: May 11, 2021

(54) ELECTRO-OPTICAL APPARATUS HAVING HIGH-THROUGHPUT ELECTRICAL DATA LINKS

(71) Applicant: Nokia Solutions and Networks OY, Espoo (FI)

(72) Inventors: Ariel Leonardo Vera Villarroel, Florham Park, NJ (US); Michael Noll, Murray Hill, NJ (US)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 0 days.

(21) Appl. No.: 16/595,698

(22) Filed: Oct. 8, 2019

(65) Prior Publication Data

US 2021/0105547 A1 Apr. 8, 2021

(51) Int. Cl.
*H04Q 11/00* (2006.01)
*H04B 10/516* (2013.01)
(Continued)

(52) U.S. Cl.
CPC ....... *H04Q 11/0005* (2013.01); *H04B 10/516* (2013.01); *H04B 10/60* (2013.01);
(Continued)

(58) Field of Classification Search
None
See application file for complete search history.

(56) References Cited

U.S. PATENT DOCUMENTS

| 5,039,194 A | 8/1991 | Block et al. |
| 5,886,539 A * | 3/1999 | Bell .................... H03K 19/0175 257/48 |

(Continued)

FOREIGN PATENT DOCUMENTS

EP 0539007 A2 4/1993

OTHER PUBLICATIONS

Chen, "40-Gb/s 0.7-V 2:1 MUX and 1:2 DEMUX with Tranformer-Coupled Technique for SerDes Interface", 2015, IEEE—Transactions on Circuits and Systems, vol. 62, No. 4 (Year: 2015).*

(Continued)

*Primary Examiner* — Darren E Wolf
(74) *Attorney, Agent, or Firm* — Mendelsohn Dunleavy, P.C.; Yuri Gruzdkov

(57) ABSTRACT

An electro-optical apparatus having an ASIC electrically linked, by way of a multistage SerDes, to an array of optical data transmitters and receivers. In an example embodiment, a first SerDes stage is connected to the ASIC by a plurality of relatively wide, short electrical buses and further connected to a second SerDes stage by a plurality of narrower, longer electrical buses. The second SerDes stage is located in close proximity to the transmitter/receiver array to enable the signals transmitted therebetween to be switched at a high frequency rate, e.g., higher than 500 MHz. The width and length of said narrower, longer electrical buses are selected such as to support a high overall data throughput for the corresponding electrical data links between the ASIC and the transmitter/receiver array while being able to afford acceptable levels of signal integrity, power usage, and timing skews in these links.

19 Claims, 6 Drawing Sheets

(51) Int. Cl.
  *H04B 10/60* (2013.01)
  *H01L 25/065* (2006.01)
  *H01L 23/367* (2006.01)
  *H01L 23/00* (2006.01)
  *H01L 23/538* (2006.01)

(52) U.S. Cl.
  CPC ...... *H01L 23/3675* (2013.01); *H01L 23/5381* (2013.01); *H01L 24/16* (2013.01); *H01L 25/0655* (2013.01); *H01L 2224/16227* (2013.01); *H04Q 2011/0039* (2013.01)

(56) References Cited

U.S. PATENT DOCUMENTS

| | | | | |
|---|---|---|---|---|
| 6,263,126 | B1* | 7/2001 | Cao | G02B 6/29349 385/24 |
| 6,856,769 | B1 | 2/2005 | Steffensen et al. | |
| 8,364,042 | B2* | 1/2013 | Shastri | H04L 7/0008 398/141 |
| 8,624,761 | B1* | 1/2014 | Gong | H03M 9/00 341/101 |
| 9,313,561 | B1* | 4/2016 | Nagarajan | H04B 10/516 |
| 2003/0025971 | A1* | 2/2003 | Price | H04B 10/2575 398/183 |
| 2008/0270655 | A1* | 10/2008 | Bracamontes Del Toro | G06F 13/4291 710/110 |
| 2011/0206381 | A1 | 8/2011 | Ji et al. | |
| 2014/0270765 | A1* | 9/2014 | Cole | H04B 10/27 398/48 |
| 2015/0139647 | A1 | 5/2015 | Soto et al. | |

OTHER PUBLICATIONS

Cisco, "Cisco Data Center Spine-and-LeafArchitecture: Design Overview", White Paper, retrieved from internet: <https://www.cisco.com/c/en/us/products/collateral/switches/nexus-7000-series-switches/white-paper-c11-737022.html>, 27 pages (2016).

Thompson-Melanson, Judy, "Learn About data Center Fabric Fundamentals", Jupiter Networks Books, Published Apr. 2015; 8 pages.

Naviasky, Eric, "Defining a New High-Speed, Multi-Protocol SerDes Architecture for Advanced Nodes" Cadence Design Systems White Paper; retrieved from internet: <URL: https://ip.cadence.com/uploads/652/Multi_protocol_SerDes_PHY_IP_WP_final-pdf>, 8 pages. (2016).

Shokrollahi, Amin, et al. "10.1 A Pin-Efficient 20.83 Gb/s/wire 0.94 pJ/bit Forwarded Clock CNRZ-5-coded SerDes up to 12mm for MCM Packages in 28nm CMOS." 2016 IEEE International Solid-State Circuits Conference (ISSCC). IEEE, 2016. pp. 182-183.

Kandou Bus Sa, "GW-28-125-USR Product Description", retrieved from internet: <URL: https://www.kandou.com/assets/downloads/product-brief-gw28-125.pdf>, [retrieved on Jan. 7, 2020] (2 pages).

"SerDes", www.wikipedia.com, 2019 [retrieved on Aug. 13, 2019] Retrieved from the Internet: <URL: https://en.wikipedia.org/wiki/SerDes> (3 pages).

Moreira, P. et al. "The GBT-SerDes ASIC prototype." Journal of Instrumentation 5.11 (2010): C11022, 7 pages.

Optical Internetworking Forum "Common Electrical I/O (CEI)-Electrical and Jitter Interoperability agreements for 6G+ bps, 11G+ bps and 25G+ bps I/O." Implementation Agreement # OIF-CEI-04.0, Dec. 29, 2017 (464 pages).

\* cited by examiner

AA

ELECTRO-OPTICAL APPARATUS HAVING HIGH-THROUGHPUT ELECTRICAL DATA LINKS

BACKGROUND

Field

Various example embodiments relate to electro-optical circuits and, more specifically but not exclusively, to circuits using high-throughput electrical data links.

Description of the Related Art

This section introduces aspects that may help facilitate a better understanding of the disclosure. Accordingly, the statements of this section are to be read in this light and are not to be understood as admissions about what is in the prior art or what is not in the prior art.

The demand for higher data rates and lower latency drives the application of new technologies in communications. For example, optical communication technologies can be used to support the current and future data-rate and latency needs. The corresponding circuits may employ both electrical and/or optical components configured to exchange relatively large volumes of data at a relatively high rate. However, solutions that are based on scaling up the presently used electrical-to-optical (E/O) and/or optical-to-electrical (O/E) interface circuits may encounter significant problems, such as challenging thermal-management issues, packaging constrains, and/or tougher power-efficiency restrictions.

SUMMARY OF SOME SPECIFIC EMBODIMENTS

Disclosed herein are various embodiments of an electro-optical apparatus having an application specific integrated circuit (ASIC) electrically linked, by way of a multistage serializer/deserializer (SerDes), to an array of optical data transmitters and receivers. In an example embodiment, a first SerDes stage is connected to the ASIC by a plurality of relatively wide, short electrical buses and further connected to a second SerDes stage by a plurality of narrower, longer electrical buses. The second SerDes stage is located in close proximity to the transmitter/receiver array to enable the electrical signals transmitted therebetween to be switched at a high frequency rate, e.g., higher than 500 MHz. The width and length of said narrower, longer electrical buses can be selected such as to support a high overall data throughput for the electrical data links between the ASIC and the transmitter/receiver array while being able to afford acceptable levels of signal integrity, power usage, and timing skews in these links.

According to an example embodiment, provided is an apparatus comprising: an optical data transmitter configured to generate a modulated optical carrier; first and second electrical buses; and first and second electrical serializers serially connected between the first electrical bus and the optical data transmitter, the first electrical serializer being configured to serialize a first number of parallel bitstreams transmitted on the first electrical bus into a second number of parallel bitstreams for transmission to the second electrical serializer via the second electrical bus; and wherein the optical data transmitter is configured to generate a sequence of optical modulation symbols of the modulated optical carrier in response to a single bitstream or a plurality of parallel bitstreams generated by the second electrical serializer based on the second number of parallel bitstreams.

According to another example embodiment, provided is an apparatus comprising: an optical data receiver configured to optically receive data; first and second electrical buses; and first and second electrical deserializers serially connected between the optical data receiver and the first electrical bus, the first electrical deserializer being configured to deserialize the data optically received by the optical data receiver to generate a first number of parallel bitstreams for transmission to the second electrical deserializer via the second electrical bus; and wherein the second electrical deserializer is configured to generate a second number of parallel bitstreams based on the first number of parallel bitstreams, said second number of parallel bitstreams being transmitted on the first electrical bus.

According to yet another example embodiment, provided is an apparatus comprising: an array of optical data transmitters; an array of optical data receivers; an electrical core circuit connected to transmit data by way of the optical data transmitters and receive data by way of the optical data receivers; an array of multistage serializers, each of the multistage serializers being connected between the electrical core circuit and a respective one of the optical data transmitters; and an array of multistage deserializers, each of the multistage deserializers being connected between a respective one of the optical data receivers and the electrical core circuit.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Figure 1:
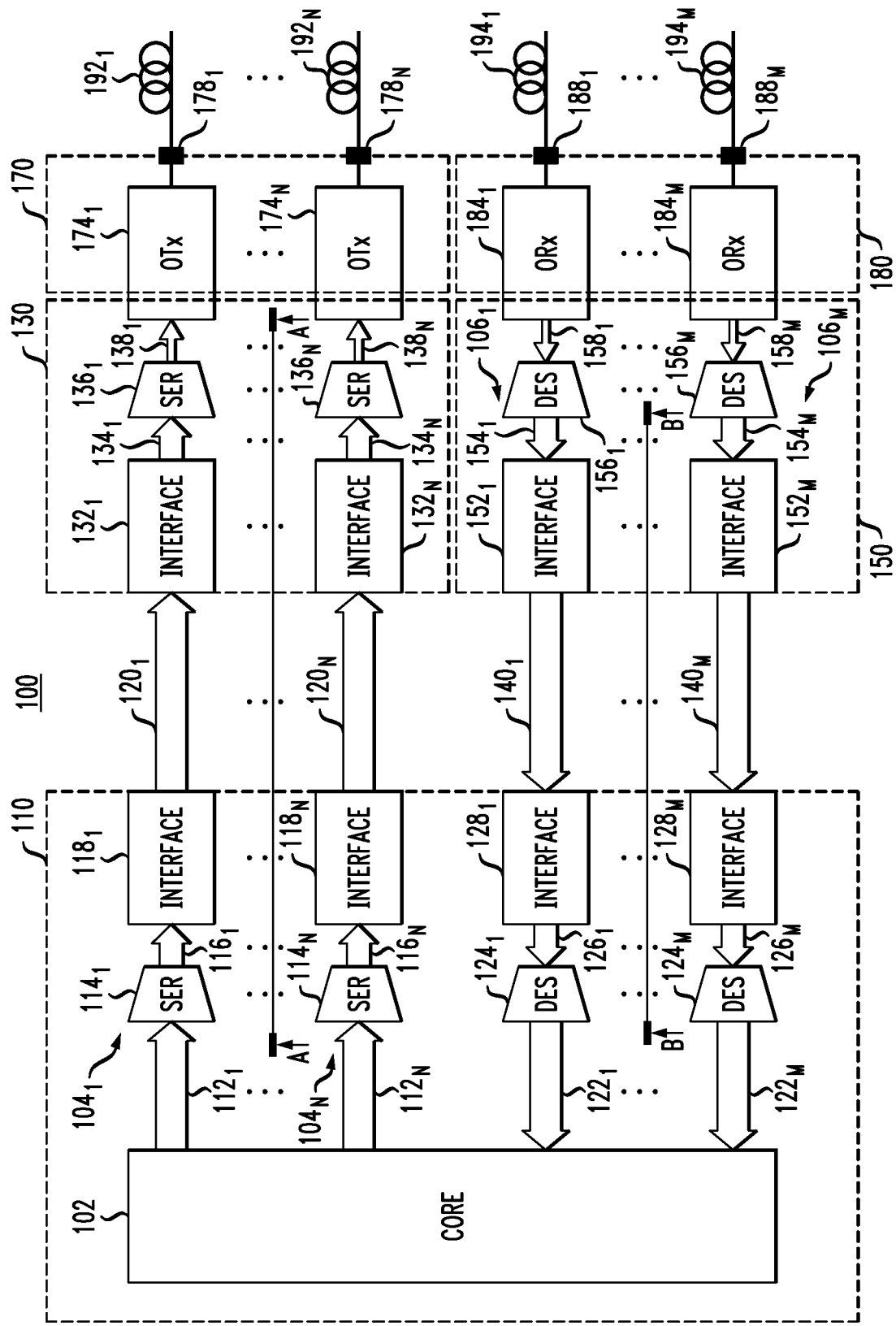
FIG. 1 shows a block diagram of an optical communication system according to an embodiment.

FIG. 1 shows a block diagram of an optical communication system (e.g., an optical network node) 100 according to an embodiment. As shown, system 100 comprises optical transmitters (OTx's) $174_1$-$174_N$ and optical receivers (ORx's) $184_1$-$184_M$, where N is an integer greater than one and M is an integer greater than one. Optical fibers $192_1$-$192_N$ are end-connected to optical output ports (e.g., fiber connectors) $178_1$-$178_N$, respectively, to transmit modulated light generated by optical transmitters $174_1$-$174_N$ to respective remote optical receivers (not explicitly shown in FIG. 1). Optical fibers $194_1$-$194_M$ are similarly end-connected to optical input ports (e.g., fiber connectors) $188_1$-$188_M$ to feed the received light to optical receivers $184_1$-$184_M$, respectively. The received light may be generated by remote optical transmitters (not explicitly shown in FIG. 1) connected to the far ends of the optical fibers $194_1$-$194_M$.

In some embodiments, the number N of optical transmitters 174 may be different from the number M of optical receivers 184. In some other embodiments, N=M.

In some embodiments, the number N can be N=1.

In some embodiments, the number M can be M=1.

System 100 comprises a core electrical circuit (e.g., an ASIC) 102 that is electrically linked to optical transmitters 174 and optical receivers 184 as explained in more detail below. As a result, circuit 102 can transmit data signals by way of optical transmitters 174 and can receive data signals by way of optical receivers 184.

The function of the core electrical circuit 102 may depend on the specific embodiment. For example, in some embodiments, system 100 can be an N×M optical-electrical-optical (OEO) switch configured to perform signal switching in the electrical domain using a corresponding N×M electrical switch implemented by the core electrical circuit 102.

In some other example embodiments, system 100 can be a multichannel OEO 3R converter. Herein, 3R stands for re-timing, re-shaping, and re-amplifying data signals. This type of system 100 can be used, e.g., for changing the assignment of carrier wavelengths of some data signals transmitted therethrough. In such embodiments, the core electrical circuit 102 is designed to support the indicated conversion.

In other example embodiments, the system architecture indicated in FIG. 1 can be used to implement a server, a router, or a next generation backplane.

In an example embodiment, system 100 comprises N transmit-channel circuits $104_1$-$104_N$ associated with the optical transmitters (OTx's) $174_1$-$174_N$, respectively, and M receive-channel circuits $106_1$-$106_M$ associated with the optical receivers (ORx's) $184_1$-$184_M$, respectively. In some embodiments, the N transmit channels may be implemented using N nominally identical circuits, e.g., different respective instances (nominal copies) of the same transmit-channel circuit. Similarly, the M receive channels may be implemented using M nominally identical circuits, e.g., different respective instances of the same receive-channel circuit.

In an example embodiment, a transmit-channel circuit $104_n$ (where n=1, . . . , N) comprises a first serializer (SER) $114_n$, a first interface circuit $118_n$, a second interface circuit $132_n$, and a second serializer $136_n$ that are serially connected in the transmit chain between the core electrical circuit 102 and optical transmitter $174_n$ using electrical buses $112_n$, $116_n$, $120_n$, $134_n$, and $138_n$. Electrical bus $112_n$ is a p-bit data bus, e.g., implemented using p parallel electrical lines, where p is an integer greater than 1. Each of electrical buses $116_n$, $120_n$, and $134_n$ is a q-bit bus, e.g., implemented using q parallel electrical lines, where q is an integer constrained by the inequality $1 < q \leq p$. Electrical bus $138_n$ is an r-bit bus, where r is an integer constrained by the inequality $1 \leq r \leq q$.

In an example embodiment, the following values of p, q, and r may be used: p=128; q=16; r=2.

In some embodiments, r=1. In such embodiments, electrical bus $138_n$ is replaced by a corresponding single electrical line.

In some embodiments, electrical bus $120_n$ may have a different number of parallel electrical lines than either of electrical buses $116_n$ and $134_n$. However, the number of parallel electrical lines in electrical bus $120_n$ may still be smaller than the number p.

In an example embodiment, optical transmitter $174_n$ may be configured to generate the corresponding optical output signal using an optical PAM-$2^r$ constellation such that, in each modulation time slot, the transmitted PAM-$2^r$ optical symbol carries the corresponding r bits applied to the optical transmitter by electrical bus $138_n$. Herein, PAM stands for pulse-amplitude modulation. A person of ordinary skill in the art will understand that other suitable optical constellations may alternatively be selected based on the number r.

In an example embodiment, serializer $114_n$ operates to compress the p bit streams applied thereto by electrical bus $112_n$ into q bit streams, which are then transmitted downstream by way of electrical bus $116_n$. Due to this compression, the resulting electrical data signals transmitted on electrical bus $116_n$ are switched at a higher frequency rate than the corresponding electrical data signals transmitted on electrical bus $112_n$.

In some embodiments, the total data rate at which electrical bus $112_n$ transmits data may be higher than, e.g., 1000 Mbps. In various embodiments, any suitable electrical modulation format can be used. Examples of such formats include but are not limited to binary non-return-to-zero (NRZ), binary return-to-zero (RZ), PAM, etc.

Electrical bus $120_n$ is typically of a greater physical length than the other electrical buses of transmit-channel circuit $104_n$. This feature is explained in more detail in reference to FIG. 2. Interface circuits $118_n$ and $132_n$ perform signal transformation and/or coding/decoding directed at making the electrical signals transmitted on electrical bus $120_n$ more resilient to the relatively strong signal distortions and loss that are typically caused by the transmission through a relatively long parallel electrical bus.

For example, each of the electrical data signals transmitted on electrical bus $116_n$ may be a sequence of binary NRZ waveforms in which one constant voltage level represents a binary "1" and the other constant voltage level represents a binary "0." In such an electrical data signal, a repeating "01" bit sequence may be represented by a sequence of substantially rectangular pulses, the rising and falling edges of which cause said electrical data signal to have relatively strongly pronounced high-frequency components that would be susceptible to strong distortions and loss in electrical bus $120_n$. However, interface circuit $118_n$ may be configured to transform a sequence of binary NRZ waveforms into a sequence of other waveforms that are shaped such as to significantly reduce the rate(s) of distortions and loss to which the resulting electrical signal is subjected in electrical bus $120_n$. Interface circuit $132_n$ can then be used to substantially recover the initial binary NRZ waveforms based on said other waveforms received via electrical bus $120_n$ from interface circuit $118_n$. The recovered binary NRZ waveforms are then transmitted further downstream on electrical bus $134_n$. Herein, NRZ stands for non-return-to-zero.

The number q and per-line bit rate for electrical bus $120_n$ may be selected such as to keep the amounts of signal processing in interface circuits $118_n$ and $132_n$ relatively small but sufficient for preserving the integrity of the electrical data signals transmitted through this electrical bus.

In an example embodiment, serializer $136_n$ operates to compress the q bit streams applied thereto by electrical bus $134_n$ into r bit streams, which are then transmitted downstream by way of electrical bus $138_n$. Due to this compression, the resulting electrical data signals transmitted on electrical bus $138_n$ are switched at an even higher frequency rate than the corresponding electrical data signals transmitted on electrical bus $134_n$. As already indicated above, in some embodiments, the number r may be r=1. In such embodiments, serializer $136_n$ operates to compress the q received bit streams into a corresponding single bit stream.

In an example embodiment, a receive-channel circuit $106_m$ (where m=1, . . . , M) comprises a first deserializer (DES) $156_m$, a first interface circuit $152_m$, a second interface circuit $128_m$, and a second deserializer $124_m$ that are serially connected in an electrical receive chain between the optical receiver $184_m$ and core electrical circuit 102 using electrical buses $122_m$, $126_m$, $140_m$, $154_m$, and $158_m$. Electrical bus $122_m$ is an s-bit data bus, e.g., implemented using s parallel electrical lines, where s is an integer greater than 1. Each of electrical buses $126_m$, $140_m$, and $154_m$ is a t-bit bus, where t is an integer constrained by the inequality 1<t<s. Electrical bus $158_m$ is a u-bit bus, where u is an integer constrained by the inequality 1<u<s.

In an example embodiment, the following values of s, t, and u may be used: s=128; t=16; u=2.

In some embodiments, u=1. In such embodiments, electrical bus $158_m$ is replaced by a corresponding single electrical line.

In some embodiments, electrical bus $140_m$ may have a different number of parallel electrical lines than either of electrical buses $128_m$ and $152_m$. However, the number of parallel electrical lines in electrical bus $140_m$ may still be smaller than the number s.

In an example embodiment, optical receiver $184_m$ may be configured to detect a received optical input signal that has been generated by the corresponding remote optical transmitter using a PAM-$2^u$ constellation such that, in each modulation time slot, the transmitted PAM-$2^u$ optical symbol carries the corresponding u bits. A person of ordinary skill in the art will understand that the use of other optical constellations is also possible, with the constellation selection being made, e.g., based on the number u.

In an example embodiment, deserializer $156_m$ operates to decompress the u bit streams applied thereto by electrical bus (or single line) $158_m$ into t bit streams, which are then transmitted upstream by way of electrical bus $154_m$. Due to this decompression, the resulting electrical data signals transmitted on electrical bus $154_m$ are switched at a lower frequency rate than the corresponding electrical data signals transmitted on electrical bus (or single line) $158_m$.

The physical length of electrical bus $140_m$ may be similar to that of electrical bus $120_n$. The physical length of electrical bus $140_m$ is also typically greater than the physical lengths of the other electrical buses of receive-channel circuit $106_m$ (also see FIG. 2). Interface circuits $152_m$ and $128_m$ perform signal transformation and/or coding/decoding directed at making the electrical signals transmitted on electrical bus $140_m$ more resilient to the relatively strong signal distortions and loss that are typically caused by the transmission through a relatively long electrical bus. In an example embodiment, interface circuit $152_m$ may be analogous to interface circuit $118_n$, and interface circuit $128_m$ may be analogous to interface circuit $132_n$.

In an example embodiment, deserializer $124_m$ operates to decompress the t bit streams applied thereto by electrical bus $126_m$ into s bit streams, which are then transmitted upstream by way of electrical bus $122_m$. Due to this decompression, the resulting electrical data signals transmitted on electrical bus $122_m$ are switched at an even lower frequency rate than the corresponding electrical data signals transmitted on electrical bus $126_m$. In at least some embodiments, electrical buses $126_m$ and $112_n$ may be clocked at the same frequency.

In various embodiments, any suitable electrical modulation format can be used for data transmission on electrical bus $122_m$. Examples of such formats include but are not limited to NRZ, RZ, and PAM.

The dashed lines in FIG. 1 indicate an example packaging solution that can be used to implement system 100 according to an embodiment. As shown, system 100 comprises five separate integrated circuits (e.g., integrated-circuit (IC) chips), each fabricated on a separate respective substrate, e.g., as known in the pertinent art (also see FIG. 2). These IC chips are packaged together to create the optical and electrical connections shown in FIG. 1.

A first integrated circuit, labeled 110, may be an ASIC that includes the core electrical circuit 102, serializers $114_1$-$114_N$, deserializers $124_1$-$124_M$, interface circuits $118_1$-$118_N$ and $128_1$-$128_M$, and electrical buses $112_1$-$112_N$, $116_1$-$116_N$, $122_1$-$122_M$, and $126_1$-$126_M$.

A second integrated circuit, labeled 130, may be a drive circuit configured to drive the optical modulators of optical transmitters $174_1$-$174_N$ in response to the data signals received via electrical buses $120_1$-$120_N$ from circuit 110. Circuit 130 may include interface circuits $132_1$-$132_N$, serializers $136_1$-$136_N$, drive-circuit portions of optical transmitters $174_1$-$174_N$, and electrical buses $134_1$-$134_N$ and $138_1$-$138_N$.

Figure 5:
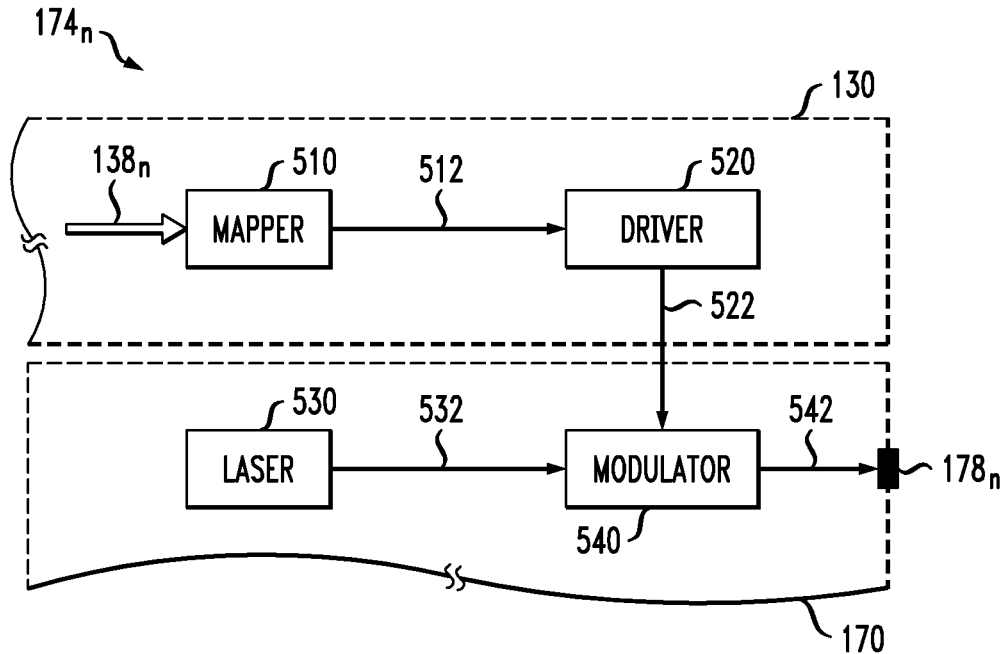
FIG. 5 shows a block diagram of an optical transmitter that can be used in the optical communication system of FIG. 1 according to an embodiment.

A third integrated circuit, labeled 170, may be an electro-optical circuit that includes the light sources (e.g., lasers) and optical modulators of optical transmitters $174_1$-$174_N$ (also see FIG. 5). Circuit 170 may also have thereon or be directly optically connected to the fiber connectors $178_1$-$178_N$ for connecting optical fibers $192_1$-$192_N$.

A fourth integrated circuit, labeled 180, may be an electro-optical circuit that includes light detectors of optical receivers $184_1$-$184_M$ (also see FIG. 6) and some optional optical-processing elements. Circuit 180 may also have thereon or be directly optically connected to the fiber connectors $188_1$-$188_M$ for connecting optical fibers $194_1$-$194_M$.

A fifth integrated circuit, labeled 150, may be a signal-processing circuit configured to (i) recover the data encoded in the received optical signals by demodulating the corresponding electrical signals generated by the light detectors of circuit 180 and (ii) deserialize the resulting bit streams for transmission via electrical buses $140_1$-$140_M$ to circuit 110. Circuit 150 includes amplifier portions and signal slicers of optical receivers $184_1$-$184_M$ (also see FIG. 6), deserializers $156_1$-$156_M$, interface circuits $152_1$-$152_M$, and electrical buses $154_1$-$154_M$ and $158_1$-$158_M$.

In various alternative embodiments, other packaging solutions can be used to implement system 100. For example, packaging solutions that involve two, three, or four IC chips are contemplated. In general, system 100 can be implemented using any suitable, practically feasible number of IC chips.

Figure 2:
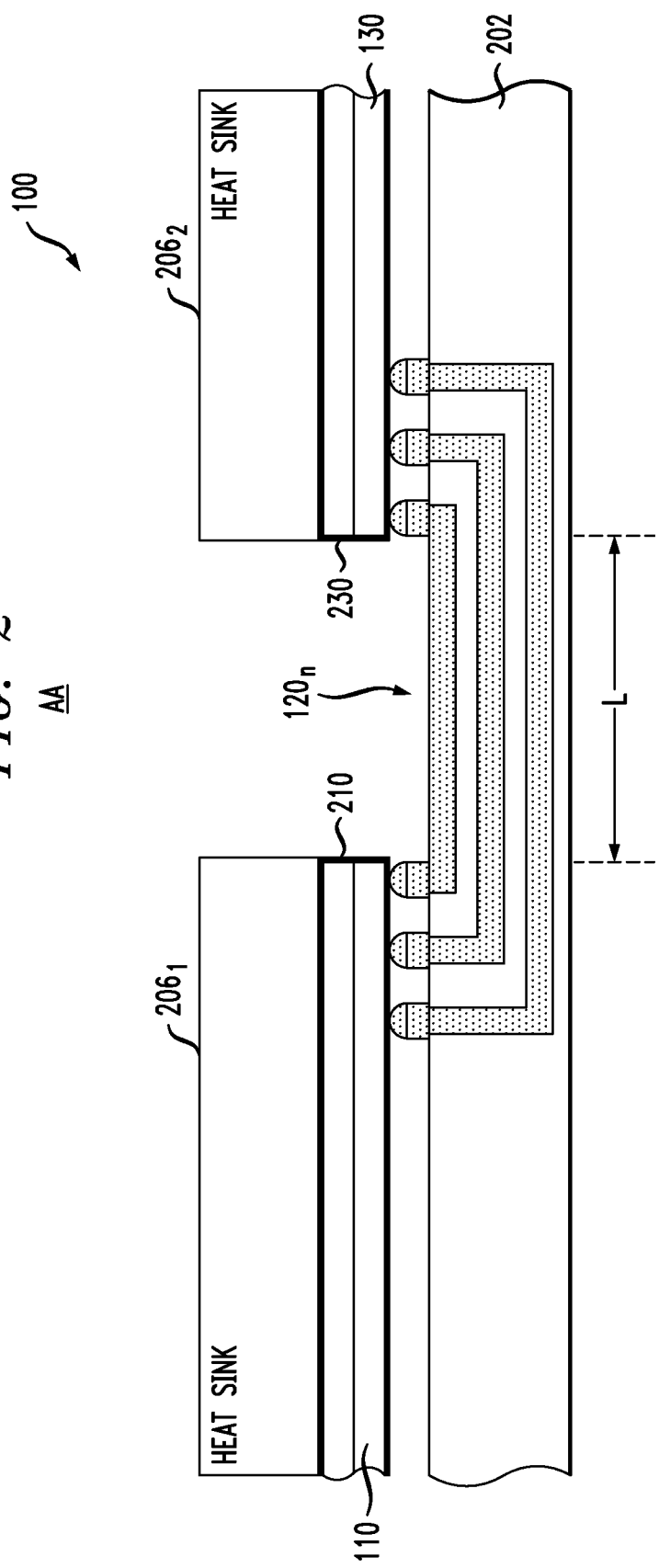
FIG. 2 shows a cross-sectional side view illustrating a circuit that can be used in the optical communication system of FIG. 1 according to an embodiment.

FIG. 2 shows a cross-sectional side view illustrating an example of system 100 according to an embodiment. The shown view corresponds to the cross-section plane AA, the location of which in system 100 is indicated in FIG. 1. A cross-sectional side view corresponding to the cross-section plane BB may be similar to the view shown in FIG. 2. The location of the cross-section plane BB in system 100 is also indicated in FIG. 1.

As shown, system 100 comprises a substrate 202 on which integrated circuits (IC chips) 110 and 130 are mounted. Substrate 202 also has the electrical bus $120_n$ that electrically connects the integrated circuits 110 and 130 as explained in reference to FIG. 1. Only three of the p parallel electrical lines of electrical bus $120_n$ are shown in FIG. 2 for simplicity. The edge-to-edge distance between the IC chips 110 and 130 is labeled as L. In some embodiments, the physical length of the electrical bus $120_n$ may be approximately L. In some other embodiments, the physical length of the electrical bus $120_n$ may be significantly greater (e.g., by about 50%) than L, e.g., due to the Manhattan-type topology of the electrical bus.

Also explicitly shown in FIG. 2 are the respective separate and distinct substrates of the integrated circuits 110 and 130, which substrates are labeled 210 and 230, respectively. In this embodiment, integrated circuits 110 and 130 are flip-chip mounted on substrate 202. Heat sinks $206_1$ and $206_2$ are attached, e.g., to the top portions of substrates 210 and 230 to improve heat dissipation therefrom.

In an example embodiment, substrate 202 can be an organic substrate or a ceramic substrate. The length L can be in the range, e.g., between about 10 mm and 50 mm or between 5 mm and 100 mm. This length should be contrasted with the typical length of the on-chip electrical buses, such as, for example, any of the electrical buses $112_1$-$112_N$, $116_1$-$116_N$, $122_1$-$122_M$, $126_1$-$126_M$, $134_1$-$134_N$, $138_1$-$138_N$, $154_1$-$154_M$, and $158_1$-$158_M$, which is typically shorter than about 2 mm.

Figure 3:
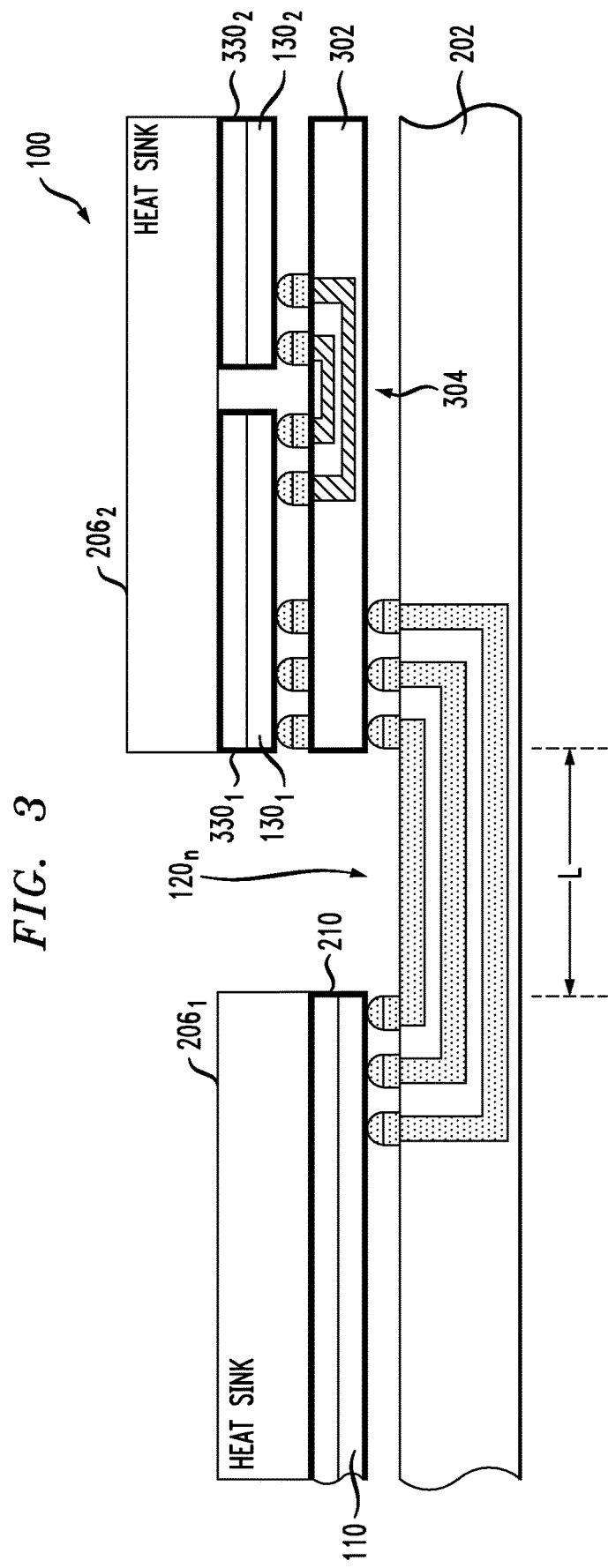
FIG. 3 shows a cross-sectional side view illustrating a circuit that can be used in the optical communication system of FIG. 1 according to another embodiment.

FIG. 3 shows a cross-sectional side view illustrating an example of system 100 according to an alternative embodiment. In the shown embodiment, the IC chip 130 shown in FIG. 2 is replaced by two corresponding IC chips (labeled $130_1$ and $130_2$) mounted on an interposer 302. The respective separate and distinct substrates of the integrated circuits $130_1$ and $130_2$ are labeled $330_1$ and $330_2$, respectively. Interposer 302 has an electrical bus 304 that electrically connects IC chips $130_1$ and $130_2$.

In an example embodiment, integrated circuit $130_1$ may have interface circuits $132_1$-$132_N$, serializers $136_1$-$136_N$, and electrical buses $134_1$-$134_N$. Integrated circuit $130_2$ may have the drive-circuit portions of optical transmitters $174_1$-$174_N$. Electrical bus 304 may include electrical buses $138_1$-$138_N$.

In some embodiments, the IC chip 150 (see FIG. 1) can similarly be replaced by two corresponding IC chips mounted on the interposer 302 or on another interposer.

In various alternative embodiments, suitable device carriers may be used instead of or in addition to substrate 202. Such a device carrier can be implemented, e.g., using any one or any suitable combination of the following: one or more substrates, one or more redistribution layers (RDLs), one or more interposers, one or more laminate plates, one or more circuit sub-mounts, etc.

Figure 4:
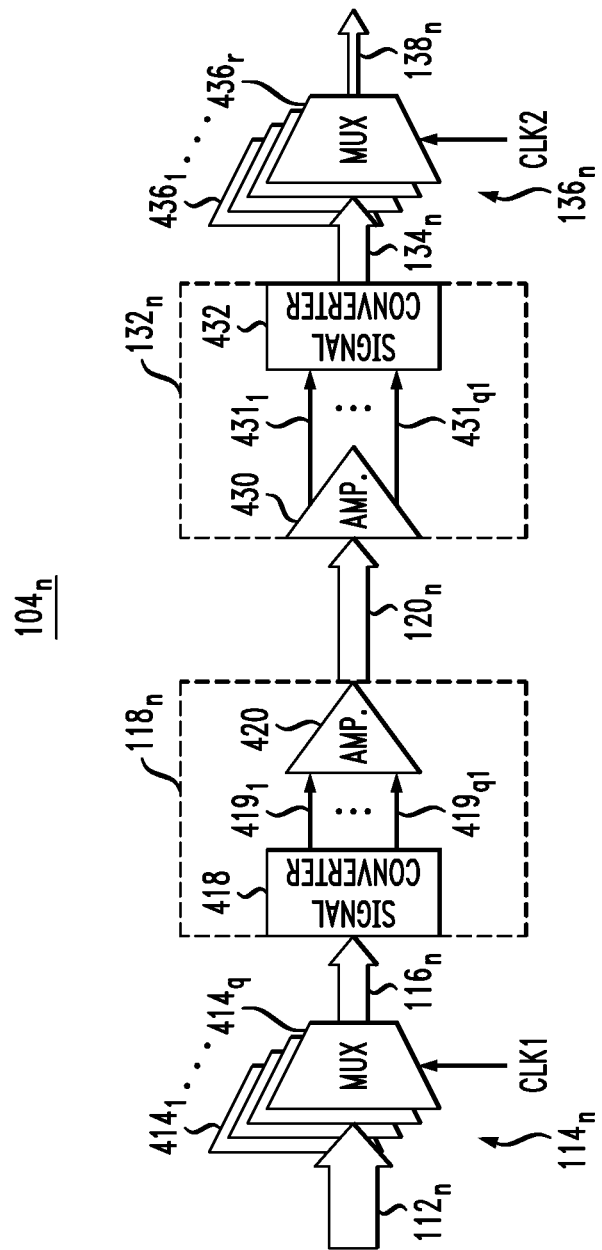
FIG. 4 shows a block diagram of a transmit-channel circuit that can be used in the optical communication system of FIG. 1 according to an embodiment.

FIG. 4 shows a block diagram of transmit-channel circuit $104_n$ according to an embodiment. In this particular embodiment, the number p is an integer multiple of the number q, i.e., $p = k_1 \times q$, where $k_1$ is an integer greater than one; and the number q is an integer multiple of the number r, i.e., $q = k_2 \times r$, where $k_2$ is an integer greater than one.

In the shown embodiment, serializer $114_n$ comprises multiplexers (MUXes) $414_1$-$414_q$, each having $k_1$ inputs and one output. Each of the MUX inputs is connected to a different respective line of electrical bus $112_n$. Each of the MUX outputs is connected to a different respective line of electrical bus $116_n$. Each of multiplexers $414_1$-$414_q$ is appropriately clocked using the clock signal CLK1 to sequentially connect its individual MUX inputs to the MUX output.

Interface circuit $118_n$ comprises a signal converter 418 and an amplifier 420. In an example embodiment, signal converter 418 operates to convert the binary NRZ signals received via electrical bus $116_n$ into a corresponding set of signals having a different modulation format, e.g., PAM-4.

In some embodiments, said corresponding set of signals may have a different number of signals than the number q, e.g., $q_1 > q$. The $q_1$ output signals $419_1$-$419_{q_1}$ generated by signal converter 418 are amplified in amplifier 420, and the $q_1$ resulting amplified signals are applied to the $q_1$ parallel lines of the electrical bus $120_n$.

Interface circuit $132_n$ comprises an amplifier 430 and a signal converter 432. Amplifier 430 operates to amplify the signals received via electrical bus $120_n$ to compensate the signal losses in the electrical bus. The resulting amplified signals $431_1$-$431_{q_1}$ are applied to the signal converter 432 that converts these signals back into the corresponding binary NRZ signals and applies these NRZ signals to the electrical bus $134_n$.

In the shown embodiment, serializer $136_n$ comprises multiplexers (MUXes) $436_1$-$436_r$, each having $k_2$ inputs and one output. Each of the MUX inputs is connected to a different respective line of electrical bus $134_n$. Each of the MUX outputs is connected to a different respective line of electrical bus $138_n$. Each of multiplexers $436_1$-$436_r$ is appropriately clocked using the clock signal CLK2 to sequentially connect its individual MUX inputs to the MUX output.

FIG. 5 shows a block diagram of optical transmitter $174_n$ according to an embodiment. Electrical bus $138_n$ and optical output port $178_n$ are also shown to better illustrate the relationship between the circuits shown in FIGS. 1 and 5. The dashed lines in FIG. 5 indicate an example partition of optical transmitter $174_n$ between integrated circuits 130 and 170 (also see FIG. 1).

In an example embodiment, optical transmitter $174_n$ comprises a constellation mapper 510, a driver circuit 520, a laser 530, and an optical modulator 540. In operation, constellation mapper 510 uses the operative constellation (e.g., a PAM-$2^r$ constellation) and a bit word supplied by electrical bus $138_n$ to determine a constellation symbol for a corresponding modulation time slot. A resulting stream 512 of such constellation symbols is applied to the driver circuit 520 that converts said stream, as known in the pertinent art, into one or more drive voltages and/or currents 522 for the optical modulator 540. In response to said one or more drive voltages and/or currents 522, the optical modulator 540 modulates an optical carrier 532 generated by the laser 530. A resulting modulated optical signal 542 is then directed to optical output port $178_n$ for further transmission.

Figure 6:
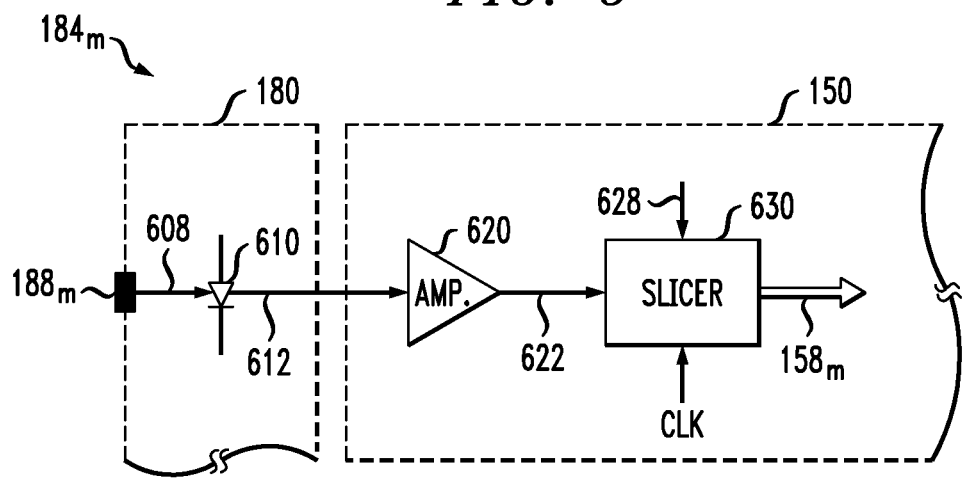
FIG. 6 shows a block diagram of an optical receiver that can be used in the optical communication system of FIG. 1 according to an embodiment.

FIG. 6 shows a block diagram of optical receiver $184_m$ according to an embodiment. Electrical bus $158_m$ and optical input port $188_m$ are also shown to better illustrate the relationship between the circuits shown in FIGS. 1 and 6. The dashed lines in FIG. 6 indicate an example partition of optical receiver $184_m$ between integrated circuits 150 and 180 (also see FIG. 1).

In an example embodiment, optical receiver $184_m$ comprises a photodetector (e.g., a photodiode) 610, an amplifier 620, and a signal slicer 630. In response to a received modulated optical signal 608, photodetector 610 generates a corresponding electrical signal 612. Amplifier 620 operates to amplify electrical signal 612, thereby generating an amplified electrical signal 622. In each modulation time slot, slicer 630 compares samples of electrical signal 622 with a set threshold voltages and, based on the comparison, determines the corresponding bit words for the electrical bus $158_m$. The determined bit words, each of which has r bits, are outputted bitwise on the parallel lines of electrical bus $158_m$.

In an example embodiment, amplifier 620 can be a multi-stage amplifier that includes a transimpedance amplifier (TIA) and one or more variable-gain amplifiers (VGAs) as stages thereof. A closed loop can be used to implement automatic gain control for amplifier 620, e.g., as known in the pertinent art. Peaking control can be used to appropriately shape the frequency response of amplifier 620, e.g., as known in the pertinent art.

In an example embodiment, slicer 630 is clocked using a clock signal CLK. The threshold voltages used in slicer 630 are set using a control signal 628. Example circuits for generating clock signal CLK and control signal 628 are described in reference to FIG. 7.

Figure 7:
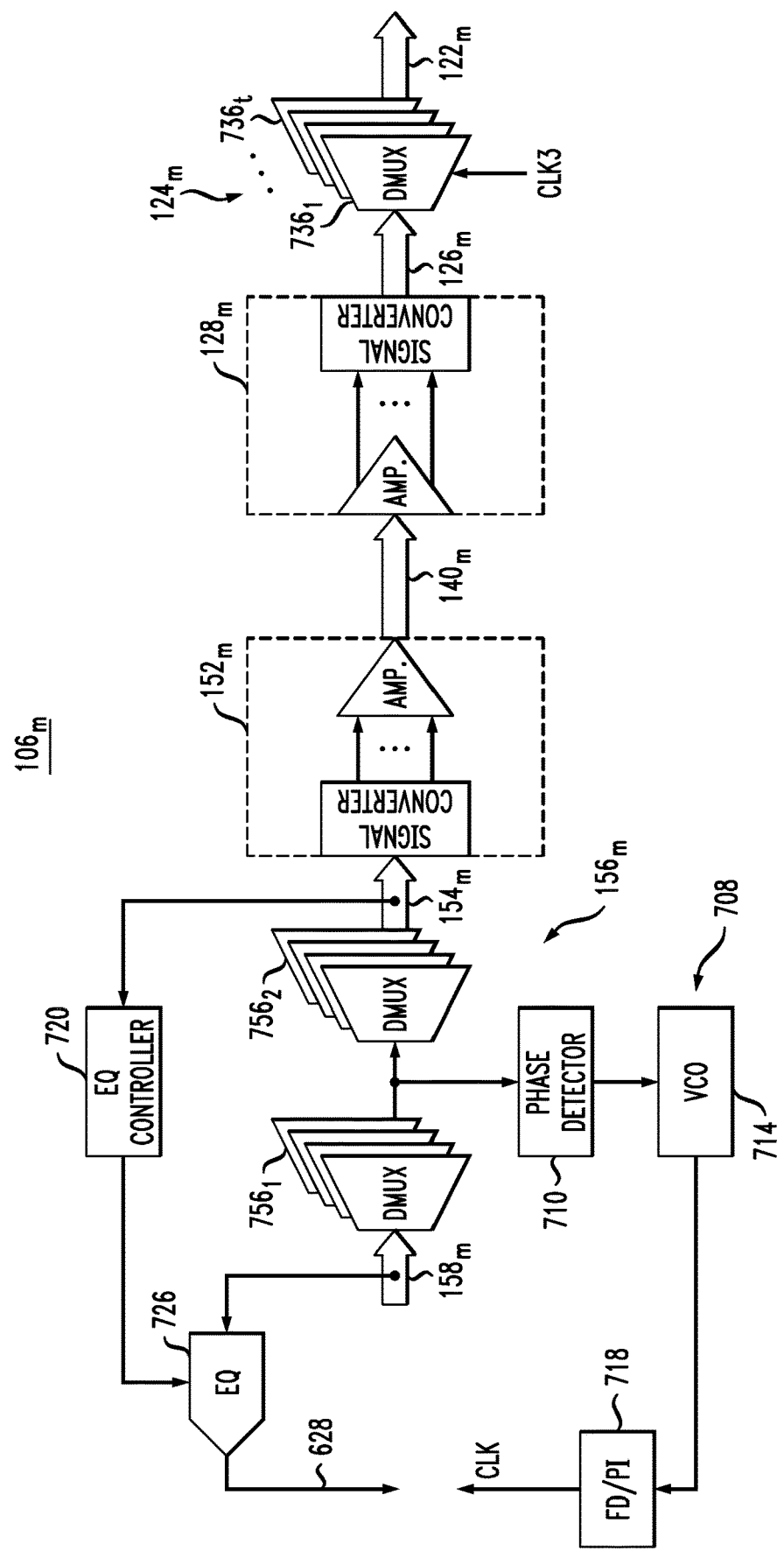
FIG. 7 shows a block diagram of a receive-channel circuit that can be used in the optical communication system of FIG. 1 according to an embodiment.

FIG. 7 shows a block diagram of receive-channel circuit $106_m$ according to an embodiment. Clock signal CLK and control signal 628 are also shown to better illustrate the relationship between the circuits shown in FIGS. 6 and 7. In this particular embodiment, the number s is an integer multiple of the number t, i.e., $s=k_3 \times t$, where $k_3$ is an integer greater than one; and the number t is an integer multiple of the number u, i.e., $t=k_4 \times u$, where $k_4$ is an integer greater than one.

In the shown embodiment, deserializer $156_m$ has serially connected DES stages $756_1$ and $756_2$, each comprising a respective set of demultiplexers (DMUXes). DES stage $756_1$ has u demultiplexers, each having one input and $k_5$ outputs, where $k_5$ is an integer greater than one. DES stage $756_2$ has $u \times k_5$ demultiplexers, each having one input and $k_6$ outputs, where $k_6$ is an integer greater than one, and $k_5 \times k_6 = k_4$. The u DMUX inputs of DES stage $756_1$ are connected to different respective lines of electrical bus $158_m$. The $u \times k_5$ DMUX outputs of DES stage $756_1$ are connected to different respective DMUX inputs of DES stage $756_2$. The t DMUX outputs of DES stage $756_2$ are connected to different respective lines of electrical bus $154_m$.

At least some of the output signals of DES stage $756_1$ may be fed into a phase detector 710 of a phase-locked loop (PLL) 708. PLL 708 further comprises a voltage-controlled oscillator (VCO) 714 and a (frequency divider)/(phase interpolator) or FD/PI 718. PLL 708 is configured to operate in a conventional manner to generate the clock signal CLK for slicer 630 (FIG. 6).

At least some of the input signals of DES stage $756_2$ are equalized in an adaptive equalizer (EQ) 726 to generate control signal 628 for slicer 630 (FIG. 6). The equalization coefficients used in adaptive equalizer 726 are adaptively set by an EQ controller 720 based on at least some of the output signals of DES stage $756_2$.

In an example embodiment, adaptive equalizer 726 can be a decision-feedback equalizer (DFE). In the shown configuration, the DFE can work as an adaptive equalizer because the DFE, automatically adapts to the time-varying properties of the corresponding data channel. Herein, DFE 726 can operate to reduce inter-symbol interference (ISI) and recover the received symbols. DFE 726 can then use the recovered symbols to produce an output that may be subtracted from an output of a linear equalizer. The shown feedback loop is used herein to adaptively adjust the reference level(s) used in slicer 630, e.g., as indicated in FIG. 6.

Interface circuit $152_m$ of FIG. 7 can be analogous to interface circuit $118_n$ of FIG. 4. Interface circuit $128_m$ of FIG. 7 can be analogous to interface circuit $132_n$ of FIG. 4. In some embodiments, the number $t_1$ of signals outputted by interface circuit $152_m$ may be different from the number t, e.g., $t_1 > t$. In such embodiments, interface circuit $128_m$ is configured to receive, via electrical bus $140_m$, $t_1$ different input signals and process them accordingly to generate t output signals for electrical bus $126_m$.

In the shown embodiment, deserializer $124_m$ comprises demultiplexers (DMUXes) $736_2$-$736_t$, each having one input and $k_3$ outputs. Each of the DMUX inputs is connected to a different respective line of electrical bus $126_m$. Each of the DMUX outputs is connected to a different respective line of electrical bus $122_m$. Each of demultiplexers $736_1$-$736_t$ is appropriately clocked using the clock signal CLK3 to sequentially connect the DMUX input to the different individual DMUX outputs.

According to an example embodiment disclosed above, e.g., in the summary section and/or in reference to any one or any combination of some or all of FIGS. 1-7, provided is an apparatus comprising: an optical data transmitter (e.g., $174_n$, FIG. 1) configured to generate a modulated optical carrier (e.g., 542, FIG. 5); first and second electrical buses (e.g., $112_n$, $120_n$, FIG. 1); and first and second electrical serializers (e.g., $114_n$, $136_n$, FIG. 1) serially connected between the first electrical bus (e.g., $112_n$, FIG. 1) and the optical data transmitter, the first electrical serializer being configured to serialize a first number of parallel bitstreams transmitted on the first electrical bus into a second number of parallel bitstreams for transmission to the second electrical serializer via the second electrical bus (e.g., $120_n$, FIG. 1); and wherein the optical data transmitter is configured to generate a sequence of optical modulation symbols of the modulated optical carrier in response to a single bitstream or a plurality of parallel bitstreams generated by the second electrical serializer based on the second number of parallel bitstreams.

In some embodiments of the above apparatus, the second number is smaller than the first number.

In some embodiments of any of the above apparatus, the second electrical bus has a length (e.g., L, FIG. 2) that is greater than 5 mm.

In some embodiments of any of the above apparatus, the apparatus further comprises: first and second IC chips (e.g., 110, 130, FIG. 1), the first IC chip including the first electrical serializer, the second IC chip including the second electrical serializer; and a separate substrate (e.g., 202, FIG. 2) that has the second electrical bus thereon.

In some embodiments of any of the above apparatus, the first and second IC chips are mounted on a surface of said separate substrate at a relative distance that is greater than 5 mm.

In some embodiments of any of the above apparatus, the relative distance is greater than 20 mm.

In some embodiments of any of the above apparatus, the optical data transmitter is configured to generate the optical modulation symbols using a PAM-$2^r$ constellation, where r is a number of bitstreams received by the optical data transmitter from the second electrical serializer.

In some embodiments of any of the above apparatus, the apparatus further comprises first and second interface circuits (e.g., $118_n$, $132_n$, FIG. 1), the first interface circuit being connected between the first electrical serializer and the second electrical bus, the second interface circuit being connected between the second electrical bus and the second electrical serializer; wherein the first interface circuit is configured to convert a binary waveform received from the first electrical serializer into a different waveform and apply said different waveform to the second electrical bus; and wherein the second interface circuit is configured to convert a waveform received from the second electrical bus into a binary waveform for processing in the second electrical serializer.

In some embodiments of any of the above apparatus, the first interface circuit is configured to convert the second number of parallel bitstreams into a plurality of modulated electrical signals transmitted in parallel, said modulated electrical signals being modulated in amplitude or phase or in amplitude and phase to encode data of the second number of parallel bitstreams.

In some embodiments of any of the above apparatus, a number of the modulated electrical signals transmitted in parallel is greater than the second number (e.g., $q_1 > q$, FIG. 4).

In some embodiments of any of the above apparatus, the first interface circuit is configured to convert a binary NRZ waveform received from the first serializer into a different waveform and apply said different waveform to the second electrical bus; and wherein the second interface circuit is configured to convert a waveform received from the second electrical bus into a binary NRZ waveform, said received waveform being different from the binary NRZ waveform.

In some embodiments of any of the above apparatus, the apparatus further comprises: an electrical core circuit (e.g., 102, FIG. 1) configured to generate the parallel bitstreams transmitted on the first electrical bus and a plurality of parallel bitstreams transmitted on a third electrical bus that is separate from the first and second electrical buses; and an additional optical data transmitter (e.g., $174_N$, FIG. 1) electrically connected to the electrical core circuit by a series of electrical serializers (e.g., $114_N$, $136_N$, FIG. 1) to optically transmit data of said plurality of parallel bitstreams transmitted on the third electrical bus.

In some embodiments of any of the above apparatus, the apparatus further comprises an optical data receiver (e.g., $184_m$, FIG. 1) configured to optically receive data; and wherein the electrical core circuit is electrically connected to the optical data receiver to receive another plurality of parallel bitstreams on a fourth electrical bus (e.g., $122_m$, FIG. 1) via a series of electrical deserializers (e.g., $156_m$, $124_m$, FIG. 1), said another plurality of parallel bitstreams carrying the data optically received by the optical data receiver.

In some embodiments of any of the above apparatus, the electrical core circuit comprises an N×M electrical switch, where N and M are positive integers, and at least one of N and M is greater than one.

In some embodiments of any of the above apparatus, the apparatus further comprises: an optical data receiver (e.g., $184_m$, FIG. 1) configured to optically receive data; and first and second electrical deserializers (e.g., $156_m$, $124_m$, FIG. 1) serially connected between the optical data receiver and a third electrical bus (e.g., $122_m$, FIG. 1), the first electrical deserializer being configured to deserialize the data optically received by the optical data receiver into a third number of parallel bitstreams for transmission on a fourth electrical bus (e.g., $140_m$, FIG. 1), the second electrical deserializer being configured to deserialize the third number of parallel bitstreams into a fourth number of parallel bitstreams transmitted on the third electrical bus.

In some embodiments of any of the above apparatus, the fourth electrical bus has a length (e.g., L, FIG. 2) that is greater than about 5 mm.

In some embodiments of any of the above apparatus, the fourth number is equal to the first number (e.g., p=s); and wherein the third number is equal to the second number (e.g., q=t).

According to another example embodiment disclosed above, e.g., in the summary section and/or in reference to any one or any combination of some or all of FIGS. 1-7, provided is an apparatus comprising: an optical data receiver (e.g., $184_m$, FIG. 1) configured to optically receive data; first and second electrical buses (e.g., $122_m$, $140_m$, FIG. 1); and first and second electrical deserializers (e.g., $156_m$, $124_m$, FIG. 1) serially connected between the optical data receiver and the first electrical bus (e.g., $122_m$, FIG. 1), the first electrical deserializer being configured to deserialize the data optically received by the optical data receiver to generate a first number of parallel bitstreams for transmission to the second electrical deserializer via the second electrical bus (e.g., $140_m$, FIG. 1); and wherein the second electrical deserializer is configured to generate a second number of parallel bitstreams based on the first number of parallel bitstreams, said second number of parallel bitstreams being transmitted on the first electrical bus.

In some embodiments of the above apparatus, the second number is greater than the first number.

In some embodiments of any of the above apparatus, the second electrical bus has a length (e.g., L, FIG. 2) that is greater than 5 mm.

In some embodiments of any of the above apparatus, the apparatus further comprises: first and second IC chips (e.g., 150, 110, FIG. 1), the first IC chip including the first electrical deserializer, the second IC chip including the second electrical deserializer; and a separate substrate (e.g., 202, FIG. 2) that has the second electrical bus thereon.

In some embodiments of any of the above apparatus, the first and second IC chips are mounted on a surface of said separate substrate at a relative distance that is greater than 5 mm.

In some embodiments of any of the above apparatus, the apparatus further comprises first and second interface circuits (e.g., $152_m$, $128_m$, FIG. 1), the first interface circuit being connected between the first electrical deserializer and the second electrical bus, the second interface circuit being connected between the second electrical bus and the second electrical deserializer; wherein the first interface circuit is configured to convert a binary waveform received from the first electrical deserializer into a different waveform and apply said different waveform to the second electrical bus; and wherein the second interface circuit is configured to convert a waveform received from the second electrical bus into a binary waveform for processing in the second electrical deserializer.

In some embodiments of any of the above apparatus, the first interface circuit is configured to convert the first number of parallel bitstreams into a plurality of modulated electrical signals transmitted in parallel, said modulated electrical signals being modulated in amplitude or phase or in amplitude and phase to encode data of the first number of parallel bitstreams.

In some embodiments of any of the above apparatus, a number of the modulated electrical signals transmitted in parallel is greater than the first number (e.g., $t_1 > t$).

In some embodiments of any of the above apparatus, the first interface circuit is configured to convert a binary NRZ waveform received from the first deserializer into a different waveform and apply said different waveform to the second electrical bus; and wherein the second interface circuit is configured to convert a waveform received from the second electrical bus into a binary NRZ waveform, said received waveform being different from the binary NRZ waveform.

In some embodiments of any of the above apparatus, the apparatus further comprises: an electrical core circuit (e.g., 102, FIG. 1) configured to receive the parallel bitstreams transmitted on the first electrical bus and to receive a plurality of parallel bitstreams transmitted on a third electrical bus that is separate from the first and second electrical buses; and an additional optical data receiver (e.g., $184_M$, FIG. 1) electrically connected to the electrical core circuit by a series of electrical deserializers (e.g., $156_M$, $124_M$, FIG. 1)

and configured to optically receive data used to generate said plurality of parallel bitstreams transmitted on the third electrical bus.

According to yet another example embodiment disclosed above, e.g., in the summary section and/or in reference to any one or any combination of some or all of FIGS. 1-7, provided is an apparatus comprising: an array of optical data transmitters (e.g., $174_1$-$174_N$, FIG. 1); an array of optical data receivers (e.g., $184_1$-$184_M$, FIG. 1); an electrical core circuit (e.g., 102, FIG. 1) connected to transmit data by way of the optical data transmitters and receive data by way of the optical data receivers; an array of multistage serializers (e.g., $114_n$/$136_n$, FIG. 1), each of the multistage serializers being connected between the electrical core circuit and a respective one of the optical data transmitters; and an array of multistage deserializers (e.g., $156_m$/$124_m$, FIG. 1), each of the multistage deserializers being connected between a respective one of the optical data receivers and the electrical core circuit.

In some embodiments of the above apparatus, a multistage serializer of said array of multistage serializers comprises: first and second electrical buses (e.g., $112_n$, $120_n$, FIG. 1); and first and second electrical serializers (e.g., $114_n$, $136_n$, FIG. 1) serially connected between the first electrical bus (e.g., $112_n$, FIG. 1) and the respective optical data transmitter, the first electrical serializer being configured to serialize a first number of parallel bitstreams transmitted by the core electrical circuit on the first electrical bus into a second number of parallel bitstreams for transmission to the second electrical serializer via the second electrical bus (e.g., $120_n$, FIG. 1); and wherein the respective optical data transmitter is configured to generate a sequence of optical modulation symbols in response to a single bitstream or a plurality of parallel bitstreams generated by the second electrical serializer based on the second number of parallel bitstreams.

In some embodiments of any of the above apparatus, a multistage deserializer of said array of multistage deserializers comprises: first and second electrical buses (e.g., $122_m$, $140_m$, FIG. 1); and first and second electrical deserializers (e.g., $156_m$, $124_m$, FIG. 1) serially connected between the respective optical data receiver and the first electrical bus (e.g., $122_m$, FIG. 1), the first electrical deserializer being configured to deserialize the data optically received by the respective optical data receiver to generate a first number of parallel bitstreams for transmission to the second electrical deserializer via the second electrical bus (e.g., $140_m$, FIG. 1); and wherein the second electrical deserializer is configured to generate a second number of parallel bitstreams based on the first number of parallel bitstreams, said second number of parallel bitstreams being transmitted on the first electrical bus.

In some embodiments of any of the above apparatus, a multistage serializer of said array of multistage serializers comprises: third and fourth electrical buses (e.g., $112_n$, $120_n$, FIG. 1); and first and second electrical serializers (e.g., $114_n$, $136_n$, FIG. 1) serially connected between the third electrical bus (e.g., $112_n$, FIG. 1) and the respective optical data transmitter, the first electrical serializer being configured to serialize a third number of parallel bitstreams transmitted by the core electrical circuit on the third electrical bus into a fourth number of parallel bitstreams for transmission to the second electrical serializer via the fourth electrical bus (e.g., $120_n$, FIG. 1); and wherein the respective optical data transmitter is configured to generate a sequence of optical modulation symbols in response to a single bitstream or a plurality of parallel bitstreams generated by the second electrical serializer based on the fourth number of parallel bitstreams.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three dimensional structure as shown in the figures. Such "height" would be vertical where the substrates are horizontal but would be horizontal where the substrates are vertical, and so on. Similarly, while some figures show the different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. The same type of distinction applies to the use of terms "attached" and "directly attached," as applied to a description of a physical structure. For example, a relatively thin layer of adhesive or other suitable binder can be used to implement such "direct attachment" of the two corresponding components in such physical structure.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

The functions of the various elements shown in the figures, including any functional blocks labeled as "processors" and/or "controllers," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

As used in this application, the term "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It should be appreciated by those of ordinary skill in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. An apparatus comprising:
   an optical data transmitter configured to generate a modulated optical carrier;
   first and second electrical buses;
   first and second electrical serializers serially connected between the first electrical bus and the optical data transmitter, the first electrical serializer being configured to serialize a first number of parallel bitstreams transmitted on the first electrical bus into a second number of parallel bitstreams for transmission to the second electrical serializer via the second electrical bus; and
   first and second interface circuits, the first interface circuit being connected between the first electrical serializer and the second electrical bus, the second interface circuit being connected between the second electrical bus and the second electrical serializer;
   wherein the optical data transmitter is configured to generate a sequence of optical modulation symbols of the modulated optical carrier in response to a single bitstream or a plurality of parallel bitstreams generated by the second electrical serializer based on the second number of parallel bitstreams;
   wherein the first interface circuit is configured to convert a binary waveform received from the first electrical serializer into a different waveform and apply said different waveform to the second electrical bus; and
   wherein the second interface circuit is configured to convert a waveform received from the second electrical bus into a binary waveform for processing in the second electrical serializer.

2. The apparatus of claim 1, further comprising:
   first and second IC chips, the first IC chip including the first electrical serializer, the second IC chip including the second electrical serializer; and
   a separate substrate that has the second electrical bus thereon.

3. The apparatus of claim 1, wherein the optical data transmitter is configured to generate the optical modulation symbols using a PAM-$2^r$ constellation, where r is a number of bitstreams received by the optical data transmitter from the second electrical serializer.

4. The apparatus of claim 1, wherein the first interface circuit is configured to convert the second number of parallel bitstreams into a plurality of modulated electrical signals transmitted in parallel, said modulated electrical signals being modulated in amplitude or phase or in amplitude and phase to encode data of the second number of parallel bitstreams.

5. The apparatus of claim 4, wherein a number of the modulated electrical signals transmitted in parallel is greater than the second number.

6. The apparatus of claim 1, further comprising:
an electrical core circuit configured to generate the parallel bitstreams transmitted on the first electrical bus and a plurality of parallel bitstreams transmitted on a third electrical bus that is separate from the first and second electrical buses; and
an additional optical data transmitter electrically connected to the electrical core circuit by a series of electrical serializers to optically transmit data of said plurality of parallel bitstreams transmitted on the third electrical bus.

7. The apparatus of claim 6, further comprising an optical data receiver configured to optically receive data; and
wherein the electrical core circuit is electrically connected to the optical data receiver to receive another plurality of parallel bitstreams on a fourth electrical bus via a series of electrical deserializers, said another plurality of parallel bitstreams carrying the data optically received by the optical data receiver.

8. The apparatus of claim 6, wherein the electrical core circuit comprises an N×M electrical switch, where N and M are positive integers, and at least one of N and M is greater than one.

9. The apparatus of claim 1, further comprising:
an optical data receiver configured to optically receive data; and
first and second electrical deserializers serially connected between the optical data receiver and a third electrical bus, the first electrical deserializer being configured to deserialize the data optically received by the optical data receiver into a third number of parallel bitstreams for transmission on a fourth electrical bus, the second electrical deserializer being configured to deserialize the third number of parallel bitstreams into a fourth number of parallel bitstreams transmitted on the third electrical bus.

10. An apparatus comprising:
an optical data transmitter configured to generate a modulated optical carrier;
first and second electrical buses;
first and second electrical serializers serially connected between the first electrical bus and the optical data transmitter, the first electrical serializer being configured to serialize a first number of parallel bitstreams transmitted on the first electrical bus into a different second number of parallel bitstreams for transmission to the second electrical serializer via the second electrical bus;
an optical data receiver configured to optically receive data; and
an electrical core circuit configured to generate the parallel bitstreams transmitted on the first electrical bus, the electrical core circuit being electrically connected to the optical data receiver to receive another plurality of parallel bitstreams on a third electrical bus via a series of electrical deserializers, said another plurality of parallel bitstreams carrying the data optically received by the optical data receiver; and
wherein the optical data transmitter is configured to generate a sequence of optical modulation symbols of the modulated optical carrier in response to a single bitstream or a plurality of parallel bitstreams generated by the second electrical serializer based on the second number of parallel bitstreams.

11. The apparatus of claim 10,
wherein the electrical core circuit is further configured to generate a plurality of parallel bitstreams transmitted on a fourth electrical bus; and
wherein the apparatus further comprises an additional optical data transmitter electrically connected to the electrical core circuit by a series of electrical serializers to optically transmit data of said plurality of parallel bitstreams transmitted on the fourth electrical bus.

12. The apparatus of claim 10, wherein the second number is smaller than the first number.

13. The apparatus of claim 10, wherein electrical signals transmitted on the second electrical bus are switched at a higher frequency rate than electrical signals transmitted on the first electrical bus.

14. The apparatus of claim 10,
wherein the apparatus comprises a plurality of optical data receivers and a plurality of optical data transmitters;
wherein each of the optical data receivers is electrically connected to the electrical core circuit to electrically transmit thereto respective optically received data; and
wherein each of the optical data transmitters is electrically connected to the electrical core circuit to electrically receive therefrom respective data for optical transmission.

15. An apparatus comprising:
an optical data transmitter configured to generate a modulated optical carrier;
first and second electrical buses;
first and second electrical serializers serially connected between the first electrical bus and the optical data transmitter, the first electrical serializer being configured to serialize a first number of parallel bitstreams transmitted on the first electrical bus into a different second number of parallel bitstreams for transmission to the second electrical serializer via the second electrical bus; and
an electrical core circuit configured to generate the parallel bitstreams transmitted on the first electrical bus, the electrical core circuit comprising an N×M electrical switch, where N and M are positive integers, and at least one of N and M is greater than one; and
wherein the optical data transmitter is configured to generate a sequence of optical modulation symbols of the modulated optical carrier in response to a single bitstream or a plurality of parallel bitstreams generated by the second electrical serializer based on the second number of parallel bitstreams.

16. The apparatus of claim 15,
wherein the electrical core circuit is further configured to generate a plurality of parallel bitstreams transmitted on a third electrical bus; and
wherein the apparatus further comprises an additional optical data transmitter electrically connected to the electrical core circuit by a series of electrical serializers to optically transmit data of said plurality of parallel bitstreams transmitted on the third electrical bus.

17. The apparatus of claim 15, wherein the second number is smaller than the first number.

18. The apparatus of claim 15, wherein electrical signals transmitted on the second electrical bus are switched at a higher frequency rate than electrical signals transmitted on the first electrical bus.

19. The apparatus of claim 15,
   wherein the apparatus comprises a plurality of optical data receivers and a plurality of optical data transmitters;
   wherein each of the optical data receivers is electrically connected to the electrical core circuit to electrically transmit thereto respective optically received data; and
   wherein each of the optical data transmitters is electrically connected to the electrical core circuit to electrically receive therefrom respective data for optical transmission.

* * * * *